United States Patent
Yang et al.

(10) Patent No.: US 8,409,918 B2
(45) Date of Patent: Apr. 2, 2013

(54) SEMICONDUCTOR DEVICE AND METHOD OF FORMING PRE-MOLDED SUBSTRATE TO REDUCE WARPAGE DURING DIE MOUNTING

(75) Inventors: DaeWook Yang, Kyunggi-do (KR);
SeungWon Kim, Kyunggi-do (KR);
MinJung Kim, Kyunggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 139 days.

(21) Appl. No.: 12/875,998

(22) Filed: Sep. 3, 2010

(65) Prior Publication Data

US 2012/0056334 A1    Mar. 8, 2012

(51) Int. Cl.
*H01L 21/44* (2006.01)
*H01L 23/02* (2006.01)

(52) U.S. Cl. ........ 438/107; 438/109; 438/110; 438/112; 438/119; 438/124; 257/678; 257/686; 257/E21.499; 257/E21.502; 257/E21.503

(58) Field of Classification Search .......... 438/106–110, 438/112, 118, 119, 124–127; 257/678, 686, 257/687, 713, E21.499, E21.5, E21.502, 257/E21.503
See application file for complete search history.

(56) References Cited

U.S. PATENT DOCUMENTS

| | | | |
|---|---|---|---|
| 7,741,567 B2 * | 6/2010 | Beddingfield et al. | 174/386 |
| 7,888,172 B2 * | 2/2011 | Huang | 438/107 |
| 8,021,930 B2 * | 9/2011 | Pagaila | 438/124 |
| 8,115,293 B2 * | 2/2012 | Moon et al. | 257/686 |
| 2007/0273019 A1 | 11/2007 | Huang et al. | |
| 2010/0144101 A1 * | 6/2010 | Chow et al. | 438/127 |
| 2011/0024888 A1 * | 2/2011 | Pagaila et al. | 257/686 |
| 2011/0037155 A1 * | 2/2011 | Pagaila | 257/686 |
| 2012/0056312 A1 * | 3/2012 | Pagaila et al. | 257/684 |

* cited by examiner

*Primary Examiner* — Hsien Ming Lee
(74) *Attorney, Agent, or Firm* — Robert D. Atkins; Patent Law Group: Atkins & Associates, P.C.

(57) ABSTRACT

A semiconductor device has a substrate with a plurality of conductive vias formed through the substrate and conductive layer formed over the substrate. A first encapsulant is deposited over the substrate outside a die attach area of the substrate. The first encapsulant surrounds each die attach area over the substrate and the die attach area is devoid of the first encapsulant. A channel connecting adjacent die attach areas is also devoid of the first encapsulant. A first semiconductor die is mounted over the substrate within the die attach area after forming the first encapsulant. A second semiconductor die is mounted over the first die within the die attach area. An underfill material can be deposited under the first and second die. A second encapsulant is deposited over the first and second die and first encapsulant. The first encapsulant reduces warpage of the substrate during die mounting.

22 Claims, 11 Drawing Sheets

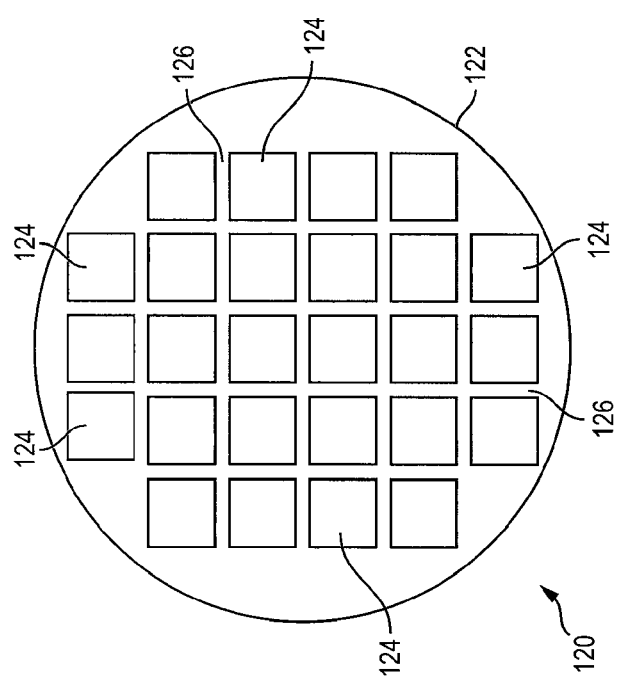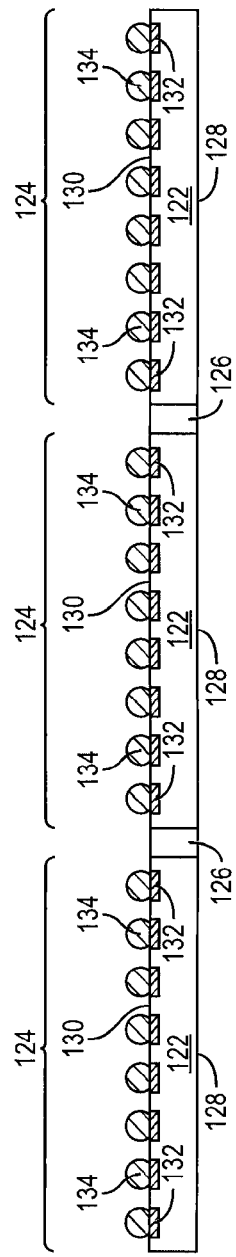

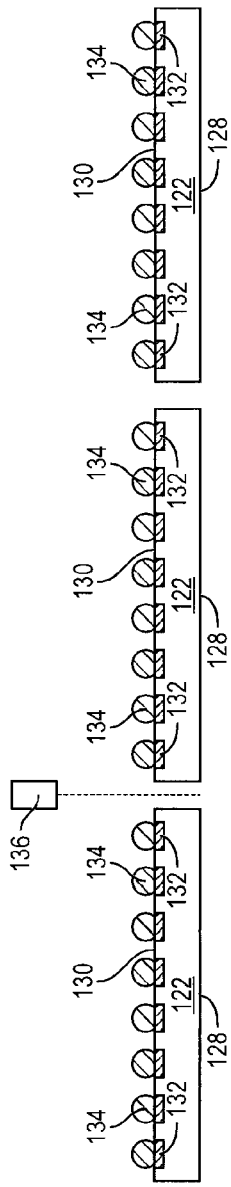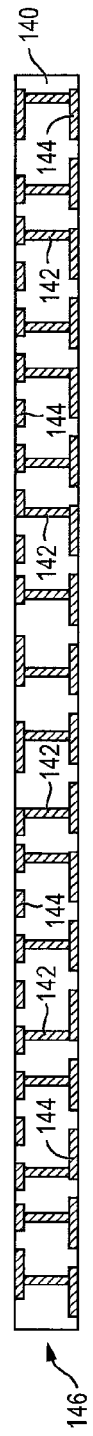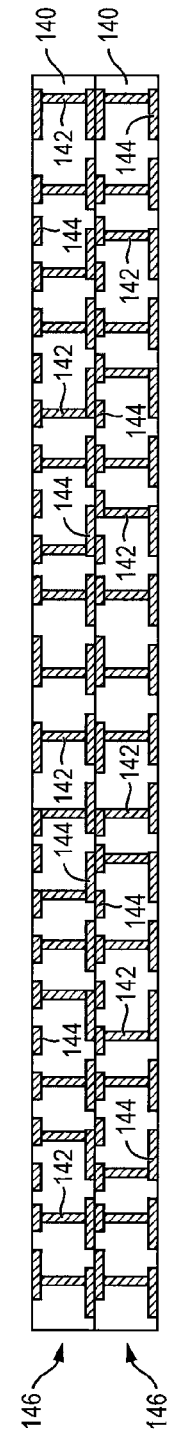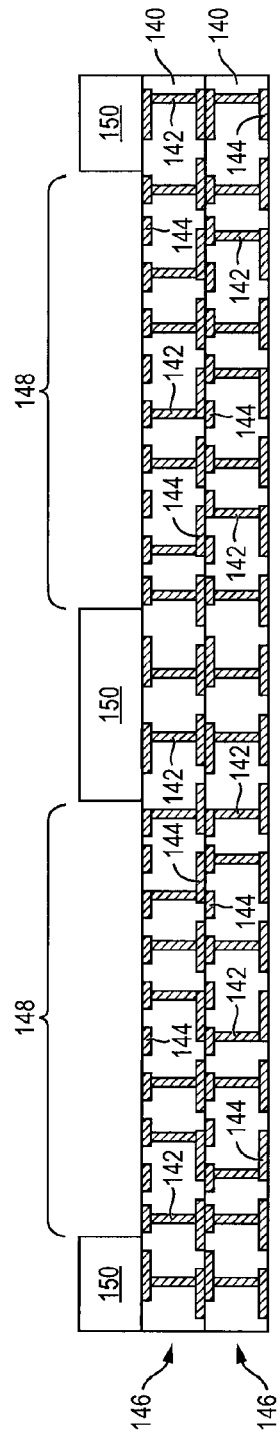
FIG. 3c
FIG. 4a
FIG. 4b
FIG. 4c

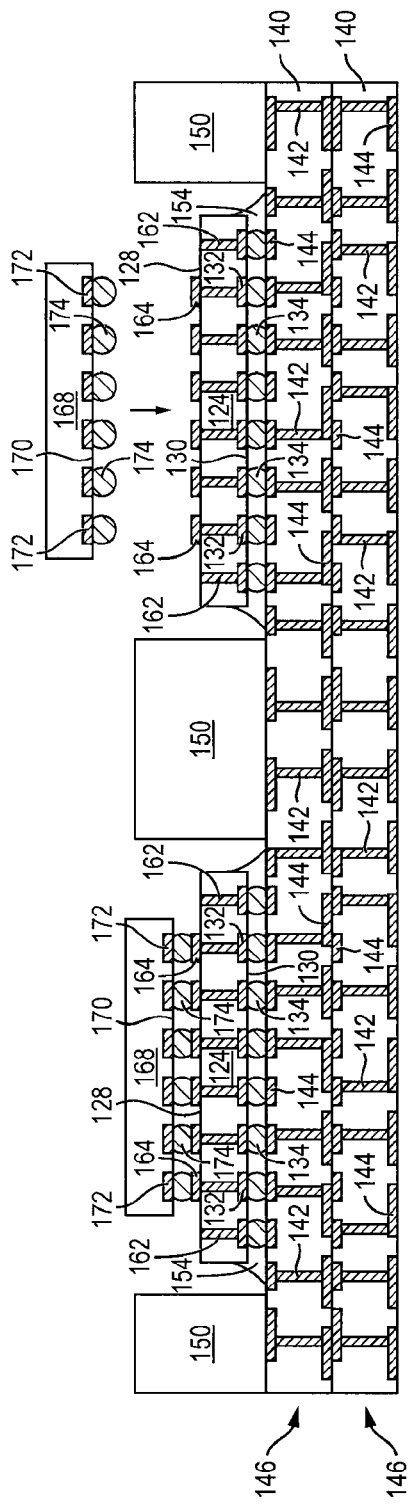
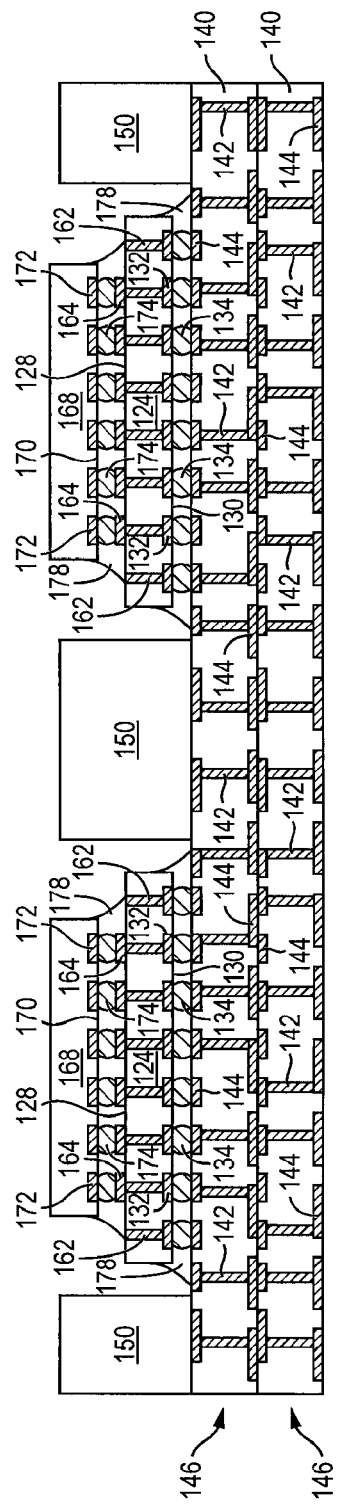
FIG. 7a
FIG. 7b

SEMICONDUCTOR DEVICE AND METHOD OF FORMING PRE-MOLDED SUBSTRATE TO REDUCE WARPAGE DURING DIE MOUNTING

FIELD OF THE INVENTION

The present invention relates in general to semiconductor devices and, more particularly, to a semiconductor device and method of forming a pre-molded substrate to reduce warpage during die mounting.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices, include flipchip type semiconductor die, are commonly mounted and electrically connected to a substrate or PCB with bumps. The substrate or PCB is known to warp during die attach, for example, due to the heat and pressure required for bump reflow. The warpage of the substrate can cause bump joint defects or failures, particularly in fine interconnect pitch applications. The bump joint defects can be unintended bridging to the closely spaced bumps. The warpage is more pronounced when stacking semiconductor die over the substrate.

SUMMARY OF THE INVENTION

A need exists to reduce substrate warpage during die attach. Accordingly, in one embodiment, the present invention is a method of making a semiconductor device comprising the steps of providing a substrate having a plurality of conductive vias formed through the substrate and a conductive layer formed over the substrate, and depositing a first encapsulant over the substrate outside a die attach area of the substrate. The die attach area is devoid of the first encapsulant. The method further includes the steps of mounting a first semiconductor die to the substrate within the die attach area after forming the first encapsulant, mounting a second semiconductor die to the first semiconductor die within the die attach area, and depositing a second encapsulant over the first semiconductor die, second semiconductor die, and first encapsulant.

In another embodiment, the present invention is a method of making a semiconductor device comprising the steps of providing a substrate, and depositing a first encapsulant over the substrate outside a die attach area of the substrate. The die attach area is devoid of the first encapsulant. The method further includes the steps of mounting a first semiconductor die to the substrate within the die attach area after forming the first encapsulant, and depositing a second encapsulant over the first semiconductor die and first encapsulant.

In another embodiment, the present invention is a method of making a semiconductor device comprising the step of providing a substrate having a pre-molded encapsulant formed over a surface of the substrate outside a die attach area of the substrate. The die attach area is devoid of the pre-molded encapsulant. The method further includes the steps of mounting a first semiconductor die to the substrate within the die attach area, and depositing a second encapsulant over the first semiconductor die and pre-molded encapsulant.

In another embodiment, the present invention is a semiconductor device comprising a substrate having a pre-molded encapsulant formed over a surface of the substrate outside a die attach area of the substrate. The die attach area is devoid of the pre-molded encapsulant. A first semiconductor die is mounted over the substrate within the die attach area. A second encapsulant is deposited over the first semiconductor die and pre-molded encapsulant.

BRIEF DESCRIPTION OF THE DRAWINGS

FIGS. 3a-3c illustrate a semiconductor wafer with a plurality of semiconductor die separated by saw streets;

FIGS. 4a-4h illustrate a process of forming a pre-molded substrate to reduce warpage during die mounting;

FIGS. 7a-7c illustrate a process of forming a pre-molded substrate to reduce warpage during stacked die mounting;

DETAILED DESCRIPTION OF THE DRAWINGS

Figure 1:
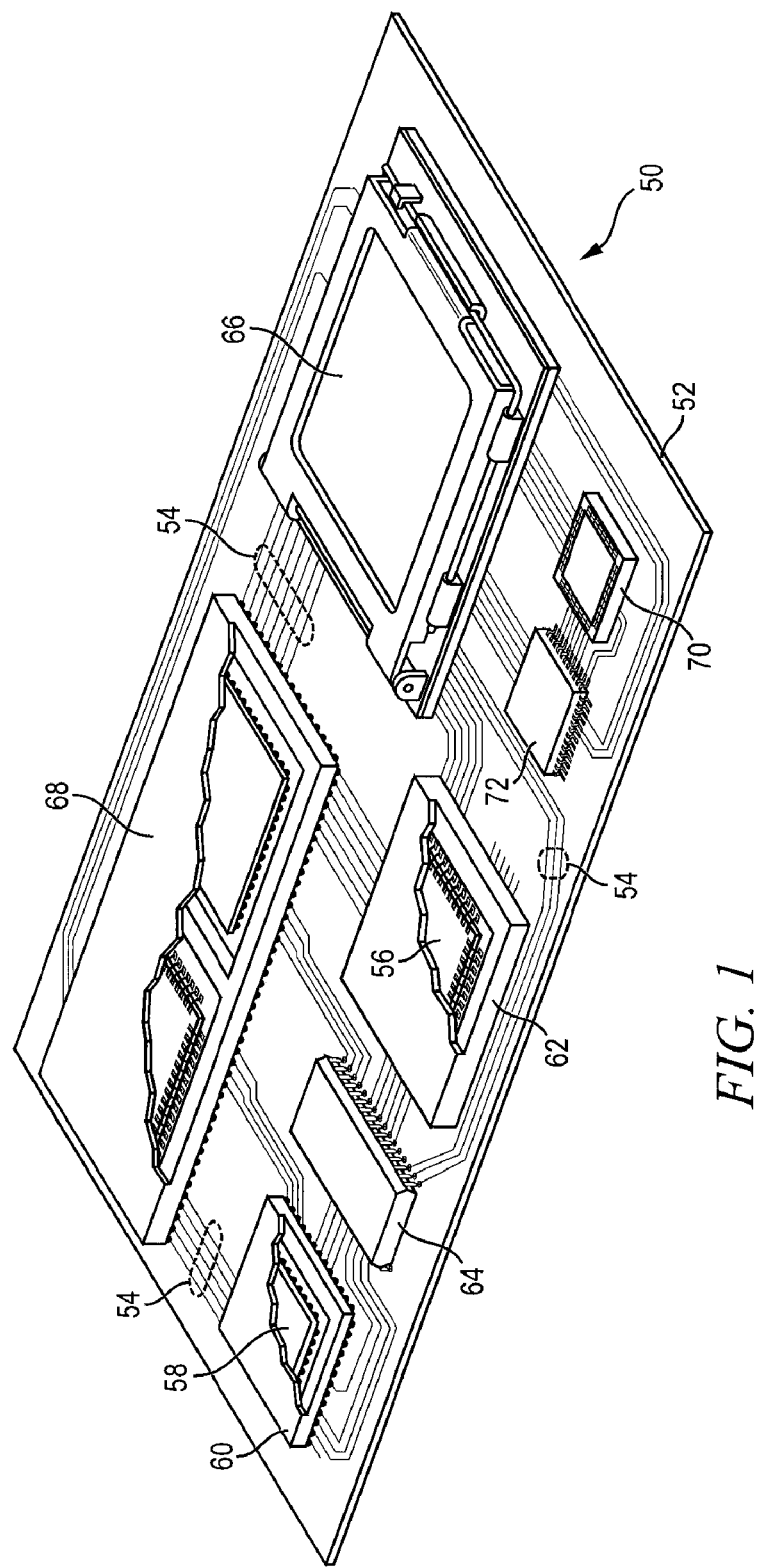
FIG. 1 illustrates a printed circuit board (PCB) with different types of packages mounted over its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted over a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
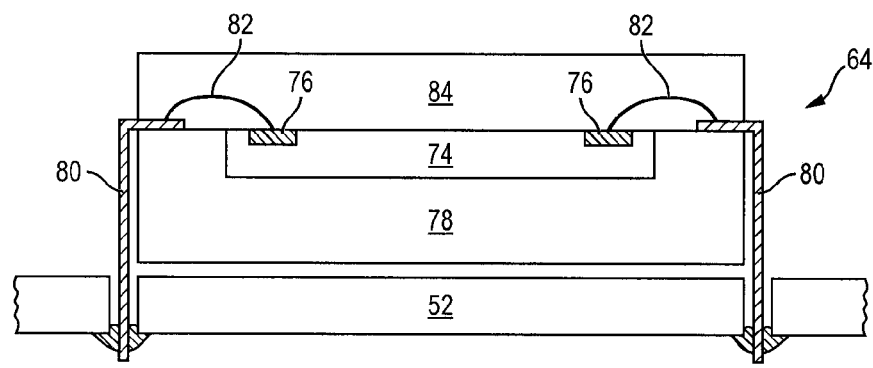
FIGS. 2a-2c illustrate further detail of the representative semiconductor packages mounted over the PCB.
Figure 2B:
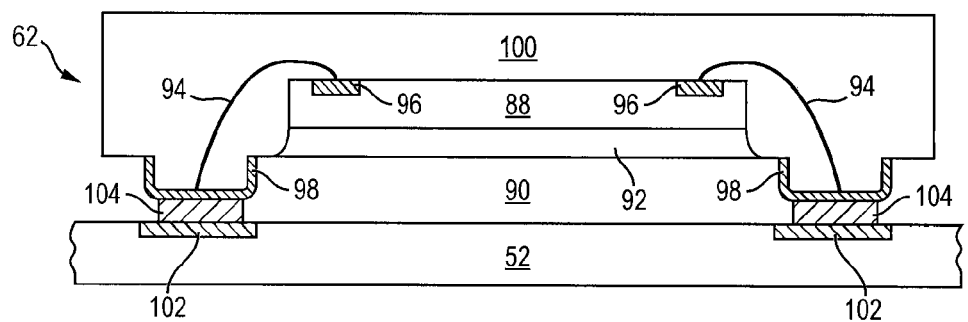
Figure 2C:
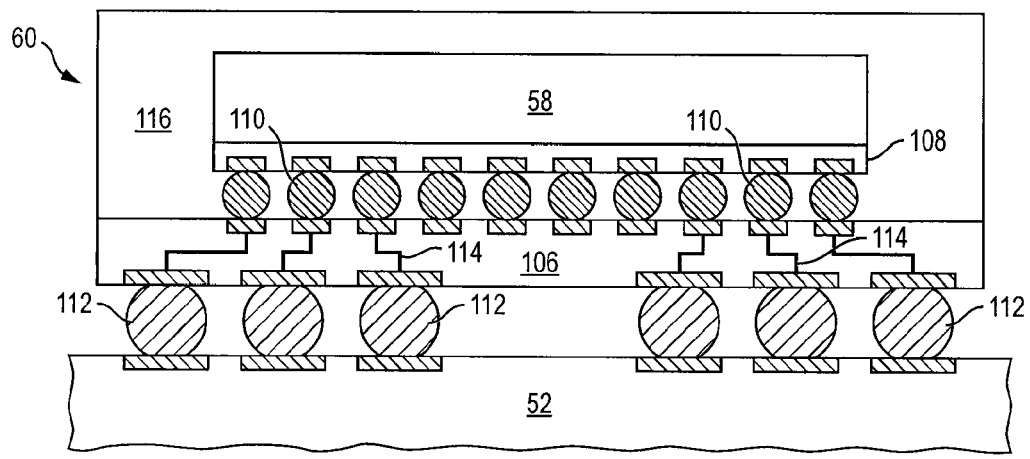

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted over an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132. In one embodiment, semiconductor die 124 is a flipchip type semiconductor die.

In FIG. 3c, semiconductor wafer 120 is singulated through saw street 126 using saw blade or laser cutting tool 136 into individual semiconductor die 124. Each semiconductor die 124 has bumps 134 formed over contact pads 132.

Figure 4D:
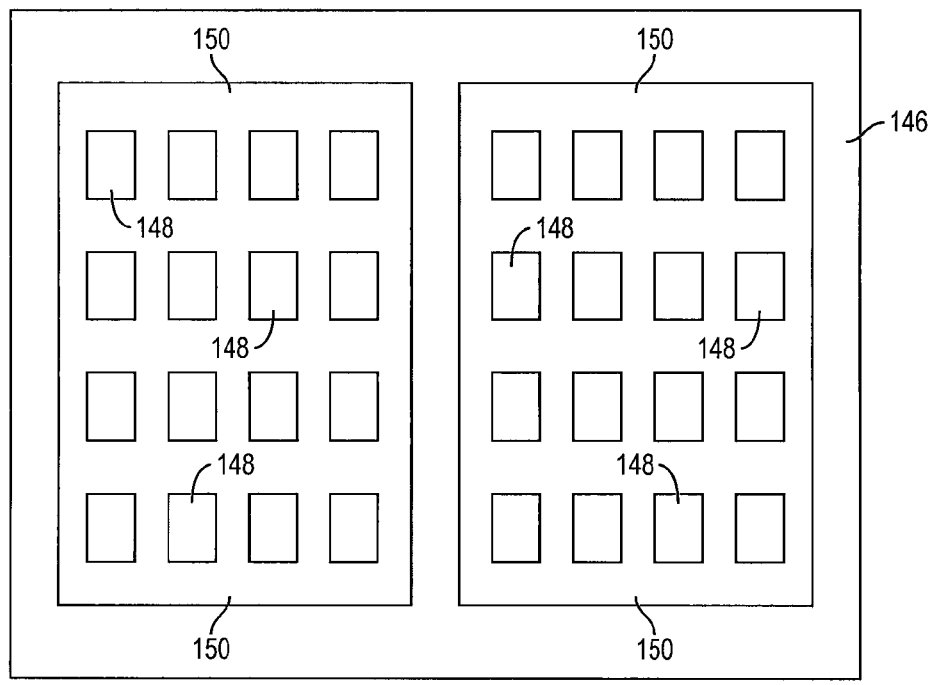

FIGS. 4a-4h illustrate, in relation to FIGS. 1 and 2a-2c, a process of forming a pre-molded substrate to reduce warpage during die mounting. FIG. 4a shows a semiconductor wafer or substrate 140 containing a base material, such as silicon, germanium, gallium arsenide, indium phosphide, or silicon carbide, for structural support. A plurality of vias is formed through substrate 140 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical conductive vias 142.

An electrically conductive layer 144 is formed over opposing surfaces of substrate 140 using PVD, CVD, electrolytic plating, electroless plating process, or other suitable metal deposition process. Conductive layer 144 can be one or more layers of Al, Cu, Sn, Ni, Au, Ag, or other suitable electrically conductive material. Substrate 140 with conductive vias 142 and conductive layer 144 constitutes a through silicon via (TSV) substrate 146. In another embodiment, conductive layer 144 is formed over substrate 140 prior to forming conductive vias 142. Conductive vias 142 are then formed through conductive layer 144 as well as substrate 140. Substrate 140 can be a PCB with electrical interconnect formed over and through the PCB.

FIG. 4b shows two TSV substrates 146 joined together for additional electrical interconnect capability. In another embodiment, substrate 140 is multi-layered with conductive vias 142 formed through the substrate layers and conductive layer 144 formed over the substrate layers.

In FIG. 4c, a die attach area 148 over TSV substrate 146 is designated for subsequent mounting of semiconductor die. TSV substrate 146 is pre-molded with encapsulant or molding compound 150 outside die attach area 148 using a paste printing, compressive molding, transfer molding, liquid encapsulant molding, vacuum lamination, spin coating, or other suitable applicator. The pre-molded encapsulant 150 can be selectively patterned outside die attach area 148, or deposited over entire TSV substrate 146 and removed from die attach area 148. In one embodiment, encapsulant 150 is deposited by transfer mold with side gate to leave die attach area 148 devoid of encapsulant. A 200 micrometer (μm) gap can be formed between the first and second mold to reduce any external void. Alternatively, in a vacuum mold process, a 70-100 μm gap is reserved for air flow. A top gate mold can also be used to deposit encapsulant 150. A keep-out zone may be needed for underfill dispensing after the first mold. Encapsulant 150 can be polymer composite material, such as epoxy resin with filler, epoxy acrylate with filler, or polymer with proper filler.

Figure 4E:
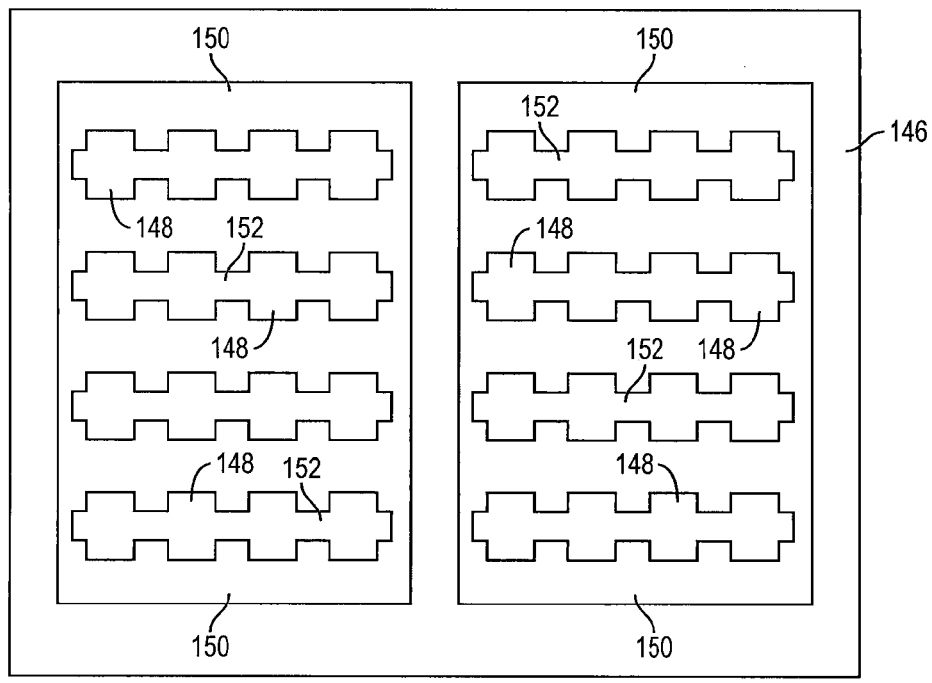

FIG. 4d shows a plan view of pre-molded encapsulant 150 deposited over TSV substrate 146. Encapsulant 150 is patterned completely around each die attach areas 148. Die attach areas 148 remain devoid of encapsulant 150 in order to mount semiconductor die to TSV substrate 146. FIG. 4e shows a plan view of another pattern of encapsulant 150 deposited over TSV substrate 146. In this case, encapsulant 150 is patterned partially around die attach areas 148 with connecting channels 152 between adjacent die attach areas 148. Die attach areas 148 and channels 152 remain devoid of encapsulant 150.

Figure 4F:
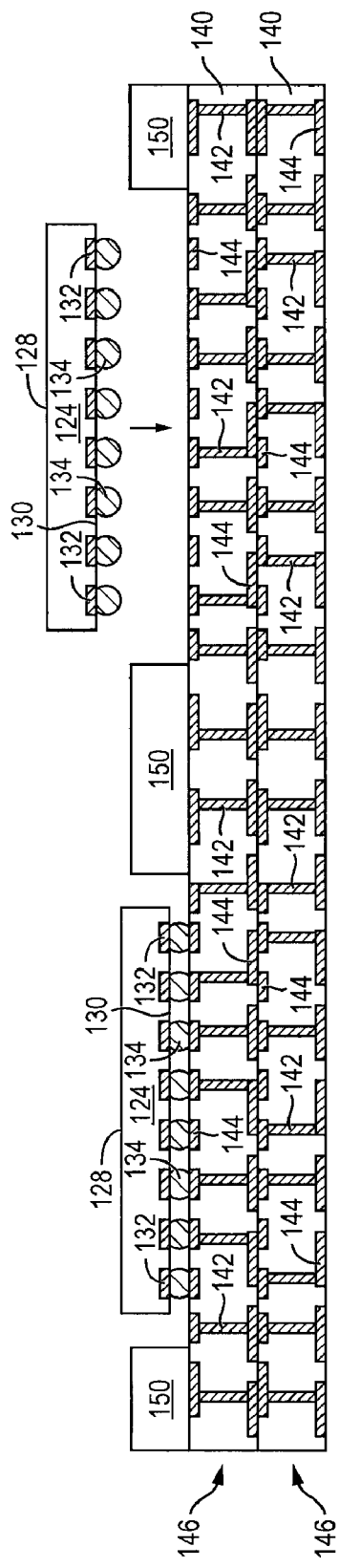

In FIG. 4f, semiconductor die 124 from FIGS. 3a-3c is mounted over TSV substrate 146 within die attach area 148 using a pick and place operation with active surface 130 oriented toward the substrate and bumps 134 aligned to conductive layer 144. The pre-mold encapsulant 150 strengthens TSV substrate 146 and reduces warpage during die attach to improve metallurgical bonding of bumps 134 and reduce unintended bridging between adjacent bumps and other joint defects during reflow, particularly for fine interconnect pitch applications.

Figure 4G:
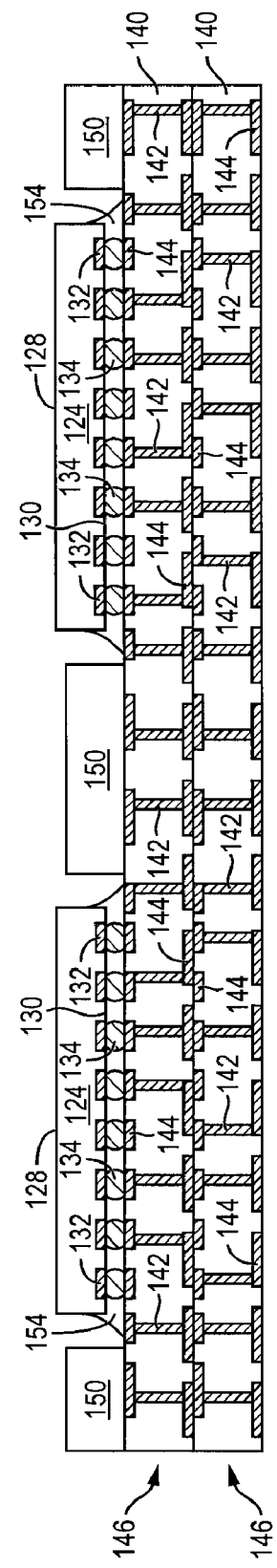

FIG. 4g shows semiconductor die 124 bonded to TSV substrate 146 within die attach area 148. The thickness of encapsulant 150 is substantially equal to or slightly less than a height of semiconductor die 124 and bumps 134. An optional underfill material 154 is deposited under semiconductor die 124. Conductive layer 144 can be wettable pads to enhance adhesion with bumps 134.

Figure 4H:
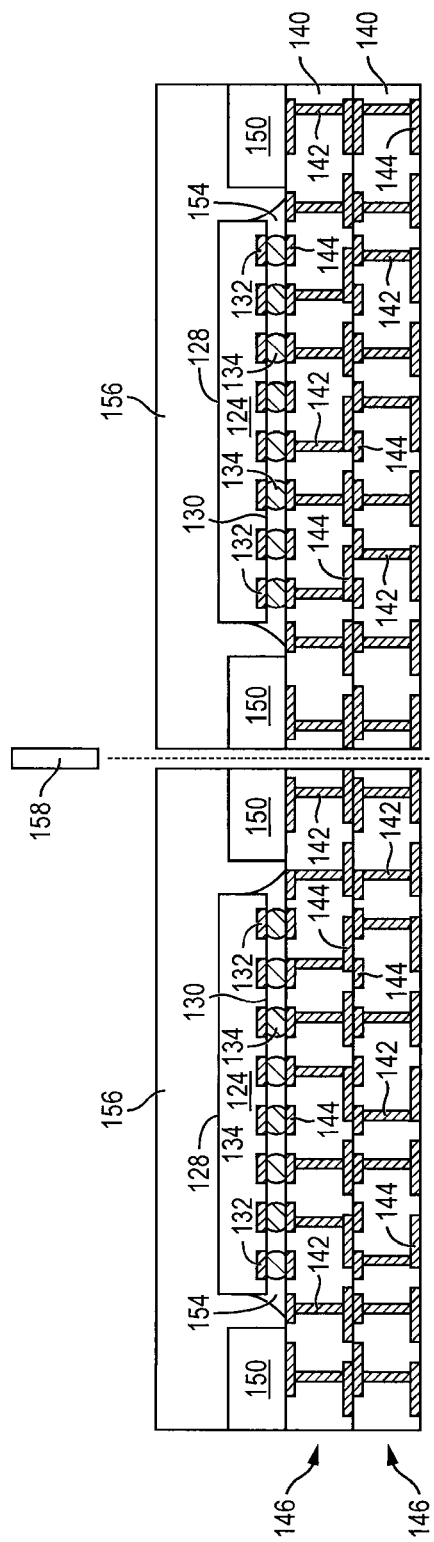

In FIG. 4h, an encapsulant or molding compound 156 is deposited over semiconductor die 124 and encapsulant 150 using a paste printing, compressive molding, transfer molding, liquid encapsulant molding, vacuum lamination, spin coating, or other suitable applicator. Encapsulant 156 can be polymer composite material, such as epoxy resin with filler, epoxy acrylate with filler, or polymer with proper filler. Encapsulant 156 is non-conductive and environmentally protects the semiconductor device from external elements and contaminants.

Figure 5:
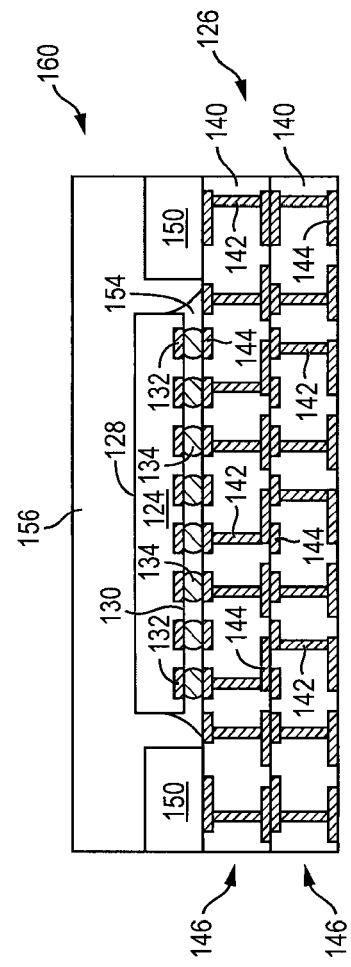
FIG. 5 illustrates the Fo-WLCSP with pre-molded substrate for mounting a semiconductor die.

TSV substrate 146 is singulated with saw blade or laser cutting tool 158 into individual Fo-WLCSP 160. FIG. 5 shows Fo-WLCSP 160 after singulation. Semiconductor die 124 is electrically connected through contact pads 132 and bumps 134 to TSV substrate 146. The pre-mold encapsulant 150 strengthens TSV substrate 146 and reduces warpage during die attach to improve metallurgical bonding of bumps 134 and reduce unintended bridging between adjacent bumps and other joint defects during reflow, particularly for fine interconnect pitch applications.

Figure 6A:
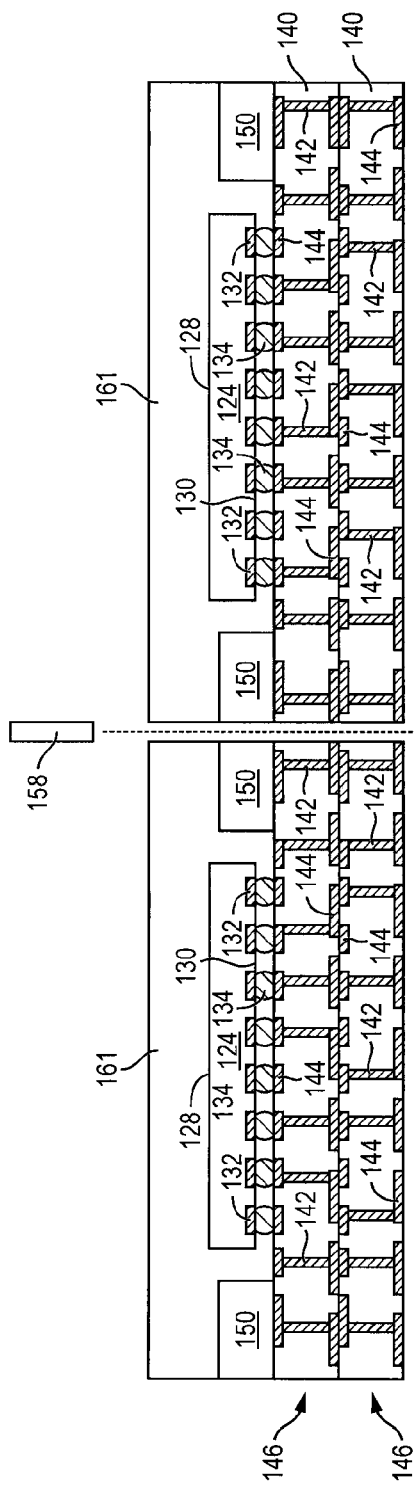
FIGS. 6a-6b illustrate a process of forming a pre-molded substrate with MUF to reduce warpage during die mounting.

In another embodiment, continuing from FIG. 4g, a mold underfill (MUF) 161 is deposited around semiconductor die 124, including over and under the die, as shown in FIG. 6a. MUF 161 can be pumped from a reservoir to a dispensing needle. MUF 161 is injected under pressure from the dispensing needle between semiconductor die 124 and TSV substrate 146 and around bumps 134. A vacuum assist can draw MUF 161 to aid with uniform distribution. MUF 161 can be polymer composite material, such as epoxy resin with filler, epoxy acrylate with filler, or polymer with proper filler. MUF 161 is non-conductive and environmentally protects the semiconductor device from external elements and contaminants.

Figure 6B:
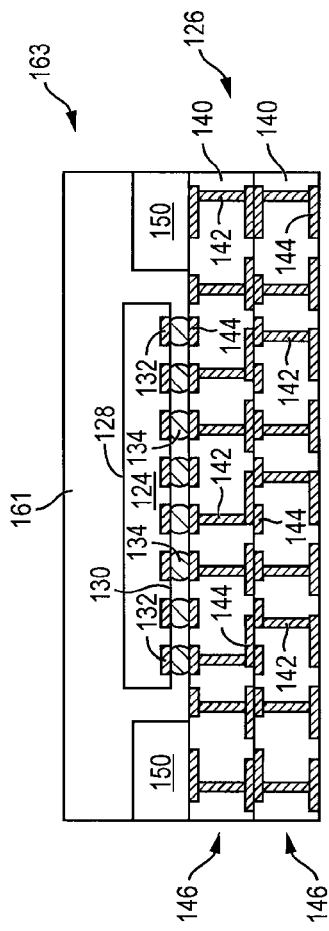

TSV substrate 146 is singulated with saw blade or laser cutting tool 158 into individual Fo-WLCSP 163. FIG. 6b shows Fo-WLCSP 163 after singulation. Semiconductor die 124 is electrically connected through contact pads 132 and bumps 134 to TSV substrate 146. The pre-mold encapsulant 150 strengthens TSV substrate 146 and reduces warpage during die attach to improve metallurgical bonding of bumps 134 and reduce unintended bridging between adjacent bumps and other joint defects during reflow, particularly for fine interconnect pitch applications. MUF 161 seals semiconductor die 124.

Figure 7C:
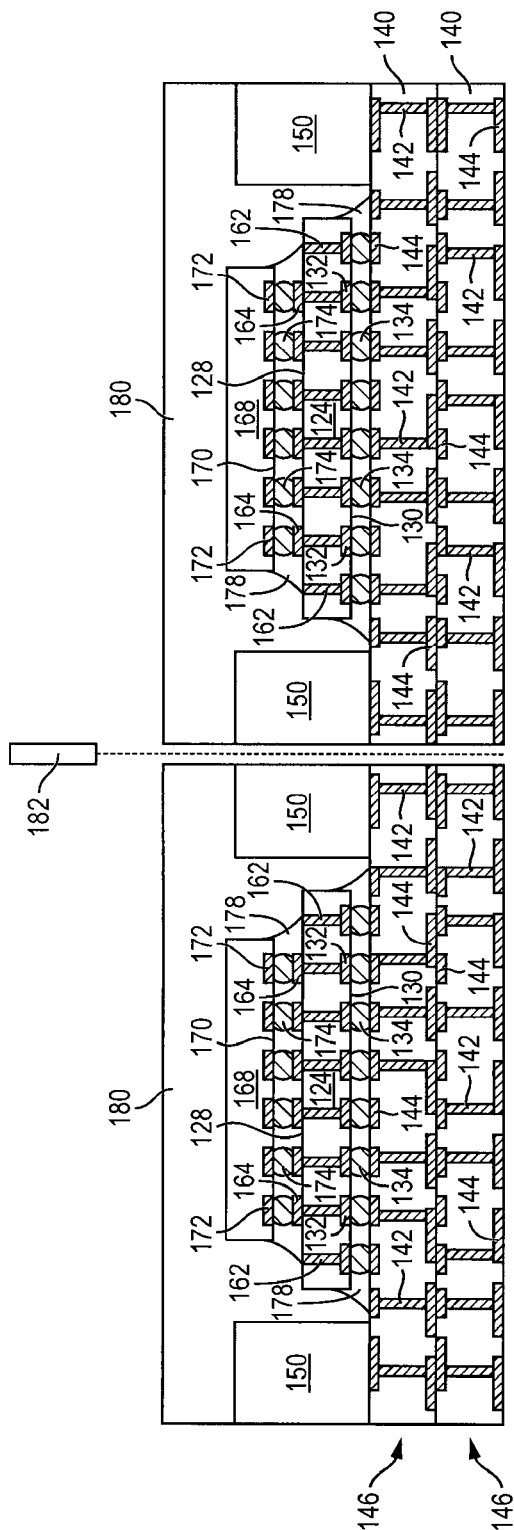

FIGS. 7a-7c show another process of forming a pre-molded substrate to reduce warpage during multiple die mounting. In this case, a plurality of conductive TSV 162 is formed through semiconductor die 124 by drilling or cutting vias through base semiconductor material 122 between contact pads 132 and back surface 128 while in wafer form, see FIGS. 3a-3c. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive TSV 162. A conductive layer 164 is also formed over back surface 128 of semiconductor die as contact pads electrically connected to conductive TSV 162.

Continuing from FIG. 4g, semiconductor die 168 has an active surface 170 containing analog or digital circuits implemented as active devices, passive devices, conductive layers, and dielectric layers formed within the die and electrically interconnected according to the electrical design and function of the die, as shown in FIG. 7a. For example, the circuit may include one or more transistors, diodes, and other circuit elements formed within active surface 170 to implement analog circuits or digital circuits, such as DSP, ASIC, memory, or other signal processing circuit. Semiconductor die 168 may also contain IPDs, such as inductors, capacitors, and resistors, for RF signal processing. Contact pads 172 are formed in active surface 170 and electrically connected to the circuits on the active surface. Bumps 174 are formed over contact pads 172. In one embodiment, semiconductor die 168 is a flipchip type semiconductor die.

Semiconductor die 168 are mounted over back surface 128 of semiconductor die 124 within die attach area 148 using a pick and place operation with active surface 170 oriented toward TSV substrate 146 and bumps 174 aligned to conductive layer 164. The pre-mold encapsulant 150 strengthens TSV substrate 146 and reduces warpage during die attach to improve metallurgical bonding of bumps 174 and reduce unintended bridging between adjacent bumps and other joint defects during reflow, particularly for fine interconnect pitch applications.

FIG. 7b shows semiconductor die 168 bonded to semiconductor die 124 with bumps 174 metallurgically and electrically connected to conductive layer 164. The thickness of encapsulant 150 is substantially equal to or slightly less than a height of the stacked semiconductor die 124 and 168. An optional underfill material 178 is deposited under semiconductor die 124 and 168.

In FIG. 7c, an encapsulant or molding compound 180 is deposited over semiconductor die 124 and 168 and encapsulant 150 using a paste printing, compressive molding, transfer molding, liquid encapsulant molding, vacuum lamination, spin coating, or other suitable applicator. Encapsulant 180 can be polymer composite material, such as epoxy resin with filler, epoxy acrylate with filler, or polymer with proper filler. Encapsulant 180 is non-conductive and environmentally protects the semiconductor device from external elements and contaminants.

Figure 8:
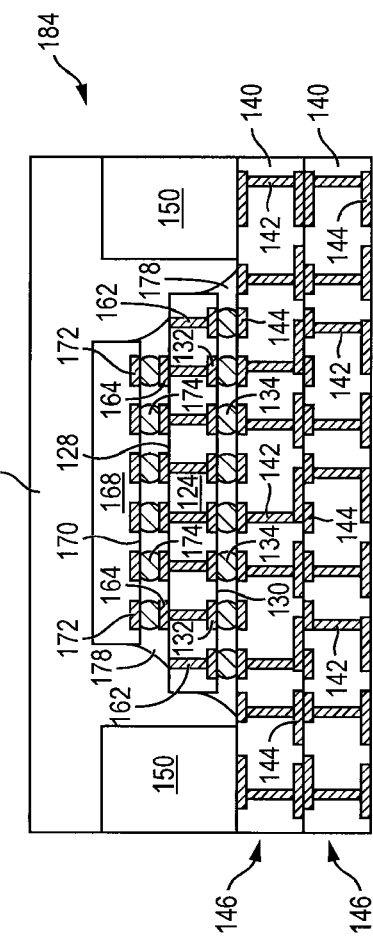
FIG. 8 illustrates the Fo-WLCSP with pre-molded substrate for mounting stacked semiconductor die.

TSV substrate 146 is singulated with saw blade or laser cutting tool 182 into individual Fo-WLCSP 184. FIG. 8 shows Fo-WLCSP 184 after singulation. Semiconductor die 124 is electrically connected through contact pads 132 and bumps 134 to TSV substrate 146. Semiconductor die 168 is electrically connected through bumps 174 and conductive TSV 162 and bumps 134 to TSV substrate 146. The pre-mold encapsulant 150 strengthens TSV substrate 146 and reduces warpage during die attach to improve metallurgical bonding of bumps 134 and 174 and reduce unintended bridging between adjacent bumps and other joint defects during reflow, particularly for fine interconnect pitch applications.

Figure 9A:
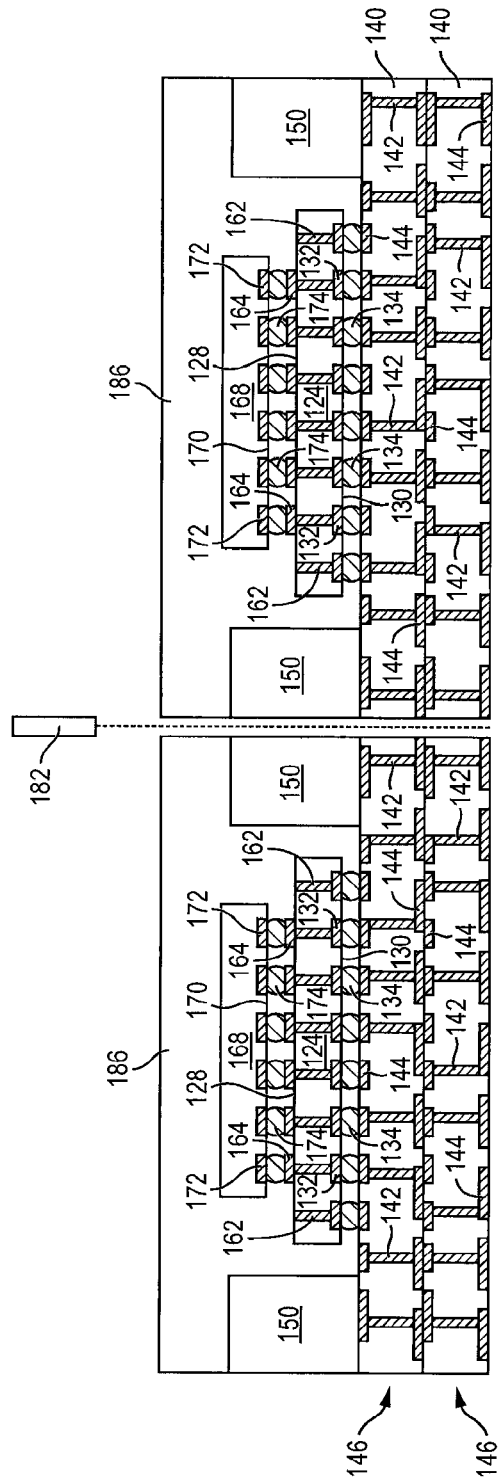
FIGS. 9a-9b illustrate a process of forming a pre-molded substrate with MUF to reduce warpage during stacked die mounting.

In another embodiment, continuing from FIG. 7b, a MUF 186 is deposited around semiconductor die 124 and 168, including over and under the die, as shown in FIG. 9a. MUF 186 can be pumped from a reservoir to a dispensing needle. MUF 186 is injected under pressure from the dispensing needle between semiconductor die 124 and 168 and TSV substrate 146 and around bumps 134 and 174. A vacuum assist can draw MUF 186 to aid with uniform distribution. MUF 186 can be polymer composite material, such as epoxy resin with filler, epoxy acrylate with filler, or polymer with proper filler. MUF 186 is non-conductive and environmentally protects the semiconductor device from external elements and contaminants.

Figure 9B:
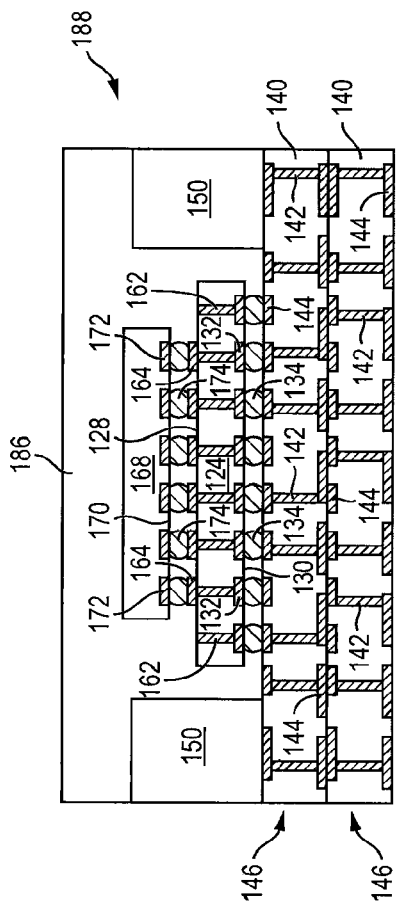

TSV substrate 146 is singulated with saw blade or laser cutting tool 158 into individual Fo-WLCSP 188. FIG. 9b shows Fo-WLCSP 188 after singulation. Semiconductor die 124 is electrically connected through contact pads 132 and bumps 134 to TSV substrate 146. Semiconductor die 168 is electrically connected through bumps 174 and conductive TSV 162 and bumps 134 to TSV substrate 146. The pre-mold encapsulant 150 strengthens TSV substrate 146 and reduces warpage during die attach to improve metallurgical bonding of bumps 134 and 174 and reduce unintended bridging between adjacent bumps and other joint defects during reflow, particularly for fine interconnect pitch applications. MUF 186 seals semiconductor die 124 and 168.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a substrate including a plurality of conductive vias formed through the substrate and a conductive layer formed over the substrate;
depositing a first encapsulant over the substrate outside a die attach area of the substrate, the die attach area being devoid of the first encapsulant;
mounting a first semiconductor die to the substrate within the die attach area after forming the first encapsulant;
mounting a second semiconductor die to the first semiconductor die within the die attach area; and
depositing a second encapsulant over the first semiconductor die, second semiconductor die, and first encapsulant.

2. The method of claim 1, wherein the first encapsulant surrounds each die attach area over the substrate.

3. The method of claim 1, further including providing a channel connecting adjacent die attach areas, wherein the channel is devoid of the first encapsulant.

4. The method of claim 1, further including depositing an underfill material beneath the first semiconductor die and second semiconductor die.

5. The method of claim 1, depositing the second encapsulant using a mold underfill process.

6. The method of claim 1, wherein the first encapsulant reduces warpage of the substrate during mounting of the first semiconductor die and second semiconductor die.

7. A method of making a semiconductor device, comprising:
providing a substrate including a conductive layer formed over the substrate;
depositing a first encapsulant over the substrate outside a die attach area of the substrate, the die attach area being devoid of the first encapsulant;
disposing a first semiconductor die over the substrate within the die attach area after depositing the first encapsulant, the first semiconductor die electrically connected to the conductive layer formed over the substrate;
depositing a second encapsulant over the first semiconductor die and first encapsulant; and
mounting a second semiconductor die to the first semiconductor die within the die attach area prior to depositing the second encapsulant.

8. The method of claim 7, further including forming a plurality of conductive vias through the first semiconductor die electrically connected to the second semiconductor die.

9. The method of claim 7, wherein the first encapsulant surrounds each die attach area over the substrate.

10. The method of claim 7, further including providing a channel connecting adjacent die attach areas, wherein the channel is devoid of the first encapsulant.

11. The method of claim 7, further including depositing an underfill material beneath the first semiconductor die.

12. A method of making a semiconductor device, comprising:
   providing a substrate including a conductive layer formed over the substrate;
   depositing a first encapsulant over the substrate outside a die attach area of the substrate, the die attach area being devoid of the first encapsulant;
   disposing a first semiconductor die over the substrate within the die attach area after depositing the first encapsulant, the first semiconductor die electrically connected to the conductive layer formed over the substrate, wherein the first encapsulant has a thickness equal to or less than a height of the first semiconductor die; and
   depositing a second encapsulant over the first semiconductor die and first encapsulant.

13. A method of making a semiconductor device, comprising:
   providing a substrate including a pre-molded encapsulant formed over a surface of the substrate outside a die attach area of the substrate, the die attach area being devoid of the pre-molded encapsulant;
   disposing a first semiconductor die over the substrate within the die attach area, the first semiconductor die electrically connected to the substrate;
   depositing a second encapsulant over the first semiconductor die and pre-molded encapsulant; and
   mounting a second semiconductor die to the first semiconductor die within the die attach area prior to depositing the second encapsulant.

14. The method of claim 13, wherein the pre-molded encapsulant reduces warpage of the substrate during mounting of the first semiconductor die and second semiconductor die.

15. The method of claim 13, wherein the pre-molded encapsulant has a thickness equal to or less than a height of the first semiconductor die and second semiconductor die.

16. The method of claim 13, wherein the pre-molded encapsulant surrounds each die attach area over the substrate.

17. A method of making a semiconductor device, comprising:
   providing a substrate including a pre-molded encapsulant formed over a surface of the substrate outside a die attach area of the substrate, the die attach area being devoid of the pre-molded encapsulant;
   mounting a first semiconductor die to the substrate within the die attach area;
   depositing a second encapsulant over the first semiconductor die and pre-molded encapsulant; and
   depositing the second encapsulant using a mold underfill process.

18. The method of claim 17, further including depositing an underfill material beneath the first semiconductor die.

19. A method of making a semiconductor device, comprising:
   providing a substrate including a conductive layer formed over the substrate;
   depositing a first encapsulant over the substrate outside a die attach area of the substrate;
   disposing a first semiconductor die over the substrate and within the die attach area after depositing the first encapsulant, the first semiconductor die electrically connected to the conductive layer formed over the substrate; and
   providing a channel connecting adjacent die attach areas, wherein the channel is devoid of the first encapsulant.

20. The method of claim 19, depositing a second encapsulant over the first semiconductor die and first encapsulant.

21. The method of claim 19, further including depositing an underfill material beneath the first semiconductor die.

22. The method of claim 19, further including disposing a second semiconductor die over the first semiconductor die.

* * * * *